(12) United States Patent
Tetz et al.

(10) Patent No.: US 8,384,105 B2
(45) Date of Patent: Feb. 26, 2013

(54) LIGHT EMITTING DIODES WITH ENHANCED THERMAL SINKING AND ASSOCIATED METHODS OF OPERATION

(75) Inventors: Kevin Tetz, Brentwood, TN (US); Charles M. Watkins, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 121 days.

(21) Appl. No.: 12/727,943

(22) Filed: Mar. 19, 2010

(65) Prior Publication Data

US 2011/0227108 A1  Sep. 22, 2011

(51) Int. Cl.
*H01L 21/00*  (2006.01)
(52) U.S. Cl. .................. 257/98; 257/88; 257/99
(58) Field of Classification Search .................. 257/98, 257/88, 99
See application file for complete search history.

(56) References Cited

U.S. PATENT DOCUMENTS

| | | | |
|---|---|---|---|
| 2,827,593 A | 3/1958 | Koller | |
| 7,070,300 B2 | 7/2006 | Harbers et al. | |
| 7,327,078 B2* | 2/2008 | Setlur et al. | 313/499 |
| 7,380,962 B2 | 6/2008 | Chaves et al. | |
| 7,740,514 B2* | 6/2010 | Setlur et al. | 445/23 |
| 8,017,415 B2* | 9/2011 | Zimmerman et al. | 438/22 |
| 2006/0091415 A1* | 5/2006 | Yan | 257/99 |
| 2006/0091416 A1* | 5/2006 | Yan | 257/99 |
| 2006/0091788 A1* | 5/2006 | Yan | 313/502 |
| 2007/0120135 A1* | 5/2007 | Soules et al. | 257/98 |
| 2008/0054280 A1* | 3/2008 | Reginelli et al. | 257/98 |
| 2008/0128730 A1* | 6/2008 | Fellows et al. | 257/98 |
| 2008/0179614 A1* | 7/2008 | Wang et al. | 257/98 |
| 2009/0154525 A1* | 6/2009 | Dai et al. | 374/178 |
| 2009/0184333 A1* | 7/2009 | Wang et al. | 257/88 |
| 2009/0236621 A1* | 9/2009 | Chakraborty | 257/95 |
| 2009/0261366 A1* | 10/2009 | Eisert et al. | 257/98 |
| 2009/0273918 A1* | 11/2009 | Falicoff et al. | 362/84 |
| 2009/0322208 A1* | 12/2009 | Shaikevitch et al. | 313/503 |
| 2009/0323341 A1* | 12/2009 | Chui | 362/249.02 |
| 2010/0047939 A1* | 2/2010 | Kamei | 438/27 |
| 2010/0065861 A1* | 3/2010 | Nagai | 257/88 |
| 2010/0258181 A1* | 10/2010 | Tischler et al. | 136/256 |
| 2011/0090696 A1* | 4/2011 | Nagai et al. | 362/293 |
| 2011/0175114 A1* | 7/2011 | Liao | 257/88 |
| 2011/0217794 A1* | 9/2011 | Tetz et al. | 438/16 |
| 2011/0217800 A1* | 9/2011 | Watkins et al. | 438/27 |
| 2011/0227108 A1* | 9/2011 | Tetz et al. | 257/98 |
| 2012/0056206 A1* | 3/2012 | Basceri et al. | 257/88 |
| 2012/0056219 A1* | 3/2012 | Basceri et al. | 257/93 |
| 2012/0068187 A1* | 3/2012 | Odnoblyudov et al. | 257/76 |
| 2012/0086028 A1* | 4/2012 | Beeson et al. | 257/98 |

OTHER PUBLICATIONS

International Search Report and Written Opinion issued Nov. 29, 2011 in International Application No. PCT/US2011/028898, 7 pages.
Feezell, D.F. et al., Development of Nonpolar and Semipolar InGaN/GaN Visible Light-Emitting Diodes, MRS Bulletin, vol. 34, pp. 318-323, May 2009.

* cited by examiner

*Primary Examiner* — Laura Menz
(74) *Attorney, Agent, or Firm* — Perkins Coie LLP

(57) ABSTRACT

Solid state lighting devices and associated methods of thermal sinking are described below. In one embodiment, a light emitting diode (LED) device includes a heat sink, an LED die thermally coupled to the heat sink, and a phosphor spaced apart from the LED die. The LED device also includes a heat conduction path in direct contact with both the phosphor and the heat sink. The heat conduction path is configured to conduct heat from the phosphor to the heat sink.

12 Claims, 6 Drawing Sheets

US 8,384,105 B2

LIGHT EMITTING DIODES WITH ENHANCED THERMAL SINKING AND ASSOCIATED METHODS OF OPERATION

TECHNICAL FIELD

The present disclosure is related to solid state lighting (SSL) devices and associated methods of operation. In particular, the present disclosure is related to light emitting diodes (LEDs) and associated methods of heat sinking.

BACKGROUND

Mobile phones, personal digital assistants (PDAs), digital cameras, MP3 players, and other portable electronic devices utilize SSL devices (e.g., white light LEDs) for background illumination. SSL devices are also used for signage and general illumination. However, true white light LEDs are not available because LEDs typically only emit at one particular wavelength. For human eyes to perceive the color white, a mixture of wavelengths is needed.

One conventional technique for emulating white light with LEDs includes depositing a converter material (e.g., a phosphor) on a light emitting material. For example, as shown in FIG. 1A, a conventional LED device 10 includes a support 2 carrying an LED die 4 and a converter material 6 deposited on the LED die 4. The LED die 4 can include one or more light emitting components. For example, as shown in FIG. 1B, the LED die 4 can include a silicon substrate 12, N-type gallium nitride (GaN) material 14, an indium gallium nitride (InGaN) material 16 (and/or GaN multiple quantum wells), and a P-type GaN material 18 on one another in series. The LED die 4 can also include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

One operational difficulty of the LED device 10 is that the LED die 4 produces a significant amount of heat during operation. The generated heat raises the temperature of the converter material 6, and thus reduces the efficiency of the converter material 6 to convert the emitted light from the LED die 4 (a phenomenon commonly referred to as "thermal quenching"). As a result, the combined emissions would appear off-white and may reduce the color fidelity of electronic devices. Accordingly, several improvements in thermal sinking structures for LED devices may be desirable.

DETAILED DESCRIPTION

Various embodiments of SSL devices and associated methods of thermal sinking are described below. The term "LED" generally refers to a semiconductor diode that converts electrical energy into electromagnetic radiation, for example, in visible, ultraviolet, and/or infrared spectra. The term "phosphor" generally refers to a material that can continue emitting light after exposure to energized particles (e.g., electrons and/or photons). A person skilled in the relevant art will also understand that the technology may have additional embodiments and that the technology may be practiced without several of the details of the embodiments described below with reference to FIGS. 2A-4C.

Figure 2A:
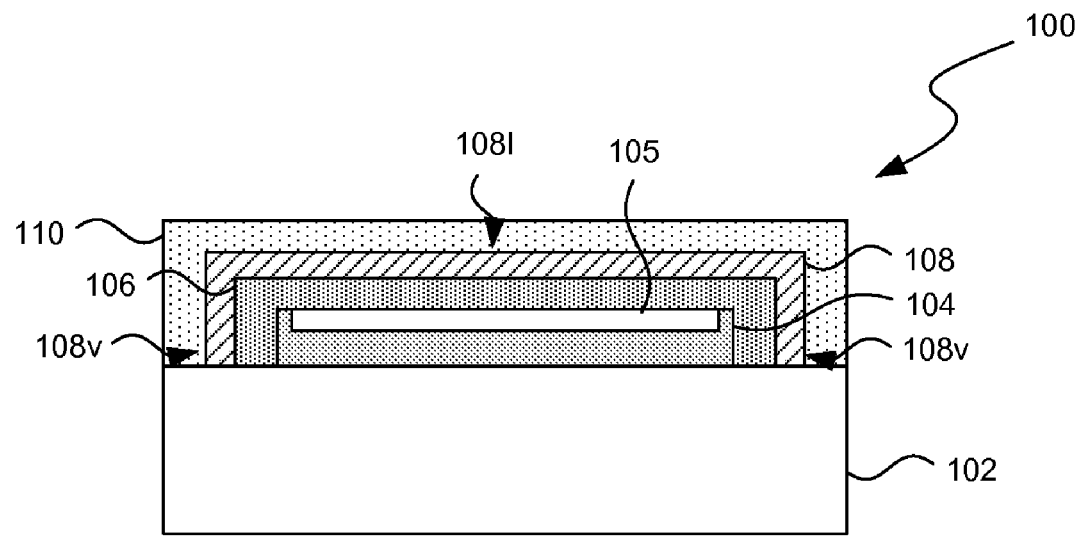
FIGS. 2A-2D are schematic cross-sectional diagrams of an LED device with a single layer of conduction material in accordance with embodiments of the technology.

FIG. 2A is a schematic cross-sectional diagram of an LED device 100 in accordance with embodiments of the technology. As shown in FIG. 2A, the LED device 100 includes a substrate 102, an LED die 104, an insulating material 106, a conduction material 108, and a converter material 110 adjacent to one another in series. Even though only the foregoing components of the LED device 100 are shown in FIG. 2A, in other embodiments, the LED device 100 can also include an encapsulant, a lens, color filters, and/or other suitable peripheral components.

The substrate 102 can include a heat sink with a thermal conductivity greater than about 1.0 W/(m·K) to transfer heat from the LED die 104 and/or the converter material 110. For example, in certain embodiments, the substrate 102 can include silicon (Si), gallium nitride (GaN), aluminum nitride (AlN), and/or other suitable semiconductor materials. In other embodiments, the substrate 102 can include copper (Cu), aluminum (Al), tungsten (W), stainless steel, and/or other suitable metal and/or metal alloys. In further embodiments, the substrate 102 can include diamond, glass, quartz, silicon carbide (SiC), aluminum oxide ($Al_2O_3$), and/or other suitable crystalline or ceramic materials.

Figure 1A:
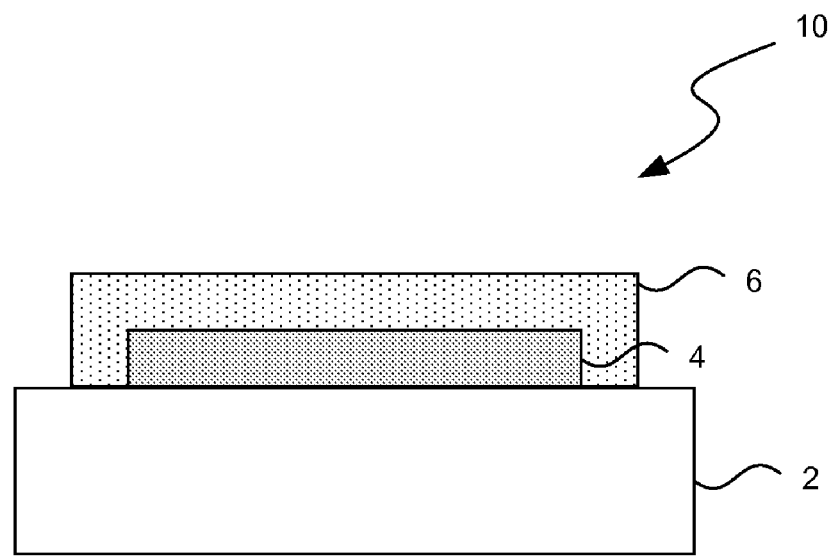
FIG. 1A is a schematic cross-sectional diagram of an LED device in accordance with the prior art.
Figure 1B:
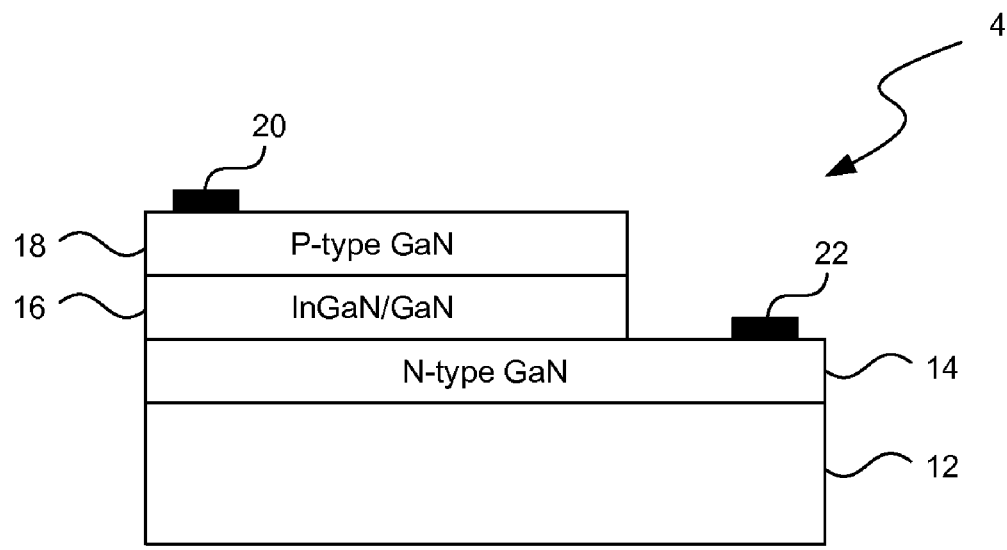
FIG. 1B is a schematic cross-sectional diagram of an LED die in accordance with the prior art.

The LED die 104 can include a single LED or a plurality of LEDs arranged in an array. The LED die 104 can be configured to emit in the visible spectrum (e.g., from about 565 nm to about 660 nm), in the infrared spectrum (e.g., from about 680 nm to about 970 nm), in the near infrared spectrum (e.g., from about 1050 nm to about 1550 nm), and/or in other suitable spectra via an emission area 105. In one embodiment, the LED die 104 can have structures and functions generally similar to those of the LED die 4 shown in FIG. 1B. In other embodiments, the LED die 104 can have other suitable structures and/or functions.

The insulating material 106 can at least partially encapsulate the LED die 104 to thermally insulate the converter material 110 from the LED die 104. Thus, the insulating material 106 can be generally transparent and having a low thermal conductivity. For example, in certain embodiments, the insulating material 106 can have a thermal conductivity less than about 0.5 W/(m·K). In other embodiments, the insulating material 106 can have a thermal conductivity less than about 0.15 W/(m·K). In further embodiments, the insulating material 106 can have other suitable thermal conductivities. The insulating material 106 can include a polyimide, a solvent-soluble thermoplastic polyimide, other polymers, ceramics, glasses, and/or other suitable thermally insulative materials.

As shown in FIG. 2A, the conduction material 108 includes a lateral portion 1081 and two vertical portions 108v extending from the lateral portion 1081 toward and in direct contact with the substrate 102. The conduction material 108 can be generally transparent at least in the emission spectra of the LED die 104. The conduction material 108 can also be thermally conductive. For example, the conduction material 108 can have a thermal conductivity of greater than about 1.0 W/(m·K), about 10.0 W/(m·K), about 100.0 W/(m·K), or other suitable conductivity values.

In one embodiment, the conduction material 108 can include a layer of indium tin oxide (ITO), fluorine-doped tin oxide (FTO), zinc oxide (ZnO), and/or other suitable inorganic transparent conducting oxides (TCOs). In other embodiments, the conduction material 108 can also include organic films of transparent conductive polymers. Examples of such transparent conductive polymers include poly(3,4-ethylenedioxythiophene), poly(4,4-dioctylcyclopentadithiophene), and/or other doped or undoped derivatives thereof. In further embodiments, the conduction material 108 can also include other suitable transparent and thermally conductive materials.

The converter material 110 can have a composition that emits at a desired wavelength under stimulation such that a combination of the emission from the LED die 104 and the converter material 110 can emulate a white light. For example, in one embodiment, the converter material 110 can include a phosphor containing cerium(III)-doped yttrium aluminum garnet (YAG) at a particular concentration for emitting a range of colors from green to yellow and to red under photoluminescence. In other embodiments, the converter material 110 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. In yet other embodiments, the converter material 110 can include europium phosphors (e.g., CaS:Eu, CaAlSiN$_3$:Eu, Sr$_2$Si$_5$N$_8$:Eu, SrS:Eu, Ba$_2$Si$_5$N$_8$:Eu, Sr$_2$SiO$_4$:Eu, SrSi$_2$N$_2$O$_2$:Eu, SrGa$_2$S$_4$:Eu, SrAl$_2$O$_4$:Eu, Ba$_2$SiO$_4$:Eu, Sr$_4$Al$_{14}$O$_{25}$:Eu, SrSiAl$_2$O$_3$N:Eu, BaMgAl$_{10}$O$_{17}$:Eu, Sr$_2$P$_2$O$_7$:Eu, BaSO$_4$:Eu, and/or SrB$_4$O$_7$:Eu).

During an initial stage of an assembly process, the LED die 104 can be physically and thermally coupled to the substrate 102 with a conductive epoxy adhesive (e.g., model No. TC-2707 provided by 3M of St. Paul, Minn.), a metallic solder material (e.g., a gold/tin solder), and/or other suitable adhesive materials (not shown). The insulating material 106 can then be formed on the LED die 104 and the substrate 102 via spin coating, chemical vapor deposition (CVD), and/or other suitable techniques. The conduction material 108 can then be formed on the insulating material 106 via physical vapor deposition (PVD, e.g., sputtering), pulsed laser deposition (PLD), and/or other suitable techniques. Subsequently, the converter material 110 may be formed on the conduction material 108 via spin coating, screen printing, and/or other suitable techniques.

In operation, electrical power is provided to the LED die 104 from an external source (not shown). The LED die 104 produces a first emission at a first wavelength from the emission area 105. The first emission from the LED die 104 passes through the transparent insulating material 106 and the conduction material 108 to reach the converter material 110. The converter material 110 then produces a second emission at a second wavelength under the stimulation of the first emission. The second emission then combines with the first emission to produce a light at least approximating a white light.

The LED die 104 also generates heat while producing the first emission. The generated heat from the LED die 104 is at least partially conducted away via the substrate 102 while the insulating material 106 at least reduces a heat flux flowing from the LED die 104 to the converter material 110. Even though the combination of the substrate 102 and the insulating material 106 may partially shield the converter material 110 from the heat produced by the LED die 104, the inventors have recognized that the converter material 110 itself also generates heat while producing the second emission. For example, the converter material 110 (e.g., cerium(III)-doped YAG) typically has a conversion rate (i.e., a percentage of produced emission per unit input) of about 75% to about 80% with the remaining input energy converted to heat. If the generated heat from the converter material 110 is not adequately dissipated, thermal quenching may still occur.

The inventors also recognized that the converter material 110 typically has low thermal conductivities. As a result, it is believed that the converter material 110 itself cannot conduct a sufficient amount of heat away to the substrate 102 even though the converter material 110 is in direct contact with the substrate 102. Thus, by interposing the conduction material 108 between the insulating material 106 and the converter material 110, the conduction material 108 may efficiently conduct at least (1) a portion of the heat generated by the LED die 104 and (2) the heat generated by the converter material 110 to the substrate 102. Accordingly, the risk of thermal quenching in the converter material 110 may be reduced or even eliminated.

Figure 2B:
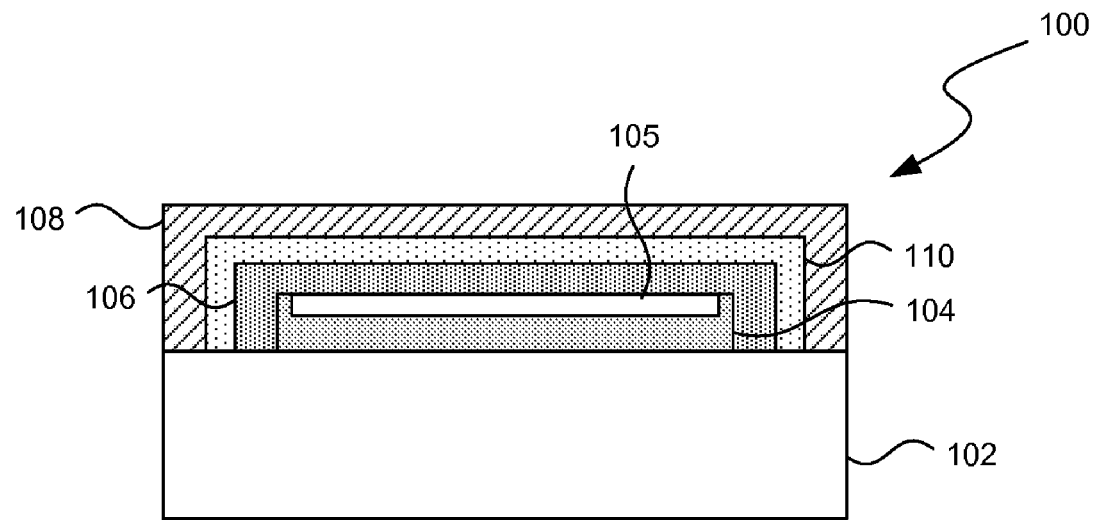

Even though the LED device 100 shown in FIG. 2A has the conduction material 108 interposed between the insulating material 106 and the converter material 110, in certain embodiments, as shown in FIG. 2B, the conduction material 108 can be spaced apart from the insulating material 106. As a result, the converter material 110 is interposed between the conduction material 108 and the insulating material 106.

Figure 2C:
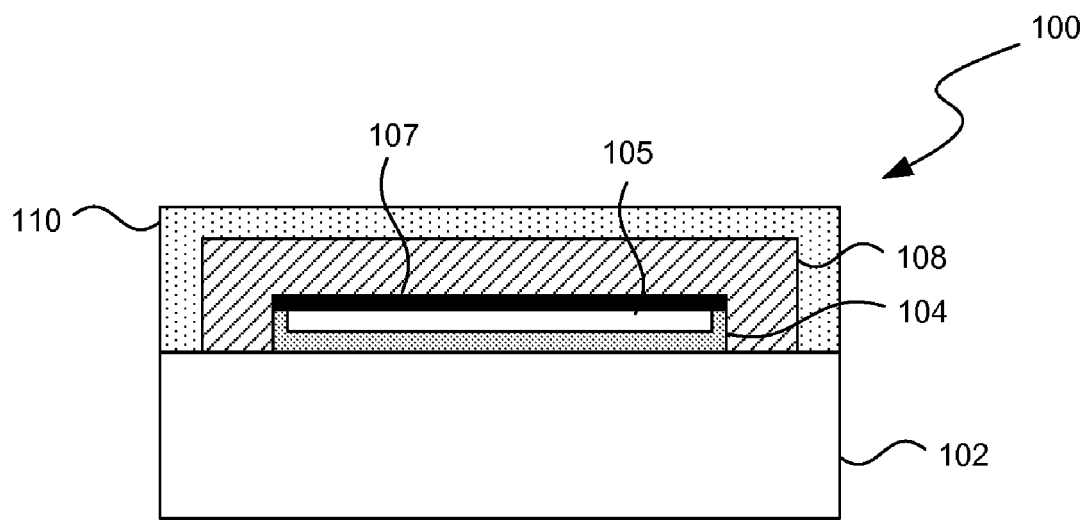

In other embodiments, as shown in FIG. 2C, the insulating material 106 may be eliminated. As a result, the conduction material 108 is interposed directly between the converter material 110 and the LED die 104. In these embodiments, the LED die 104 may optionally include an electrical insulator 107 in direct contact with the conduction material 108. The electrical insulator 107 can include silicon dioxide (SiO2), silicon nitride (SiN), and/or other suitable electrically insulating materials. In operation, the conduction material 108 conducts both (1) a portion of the heat generated by the LED die 104 and (2) the heat generated by the converter material 110 to the substrate 102.

Figure 2D:
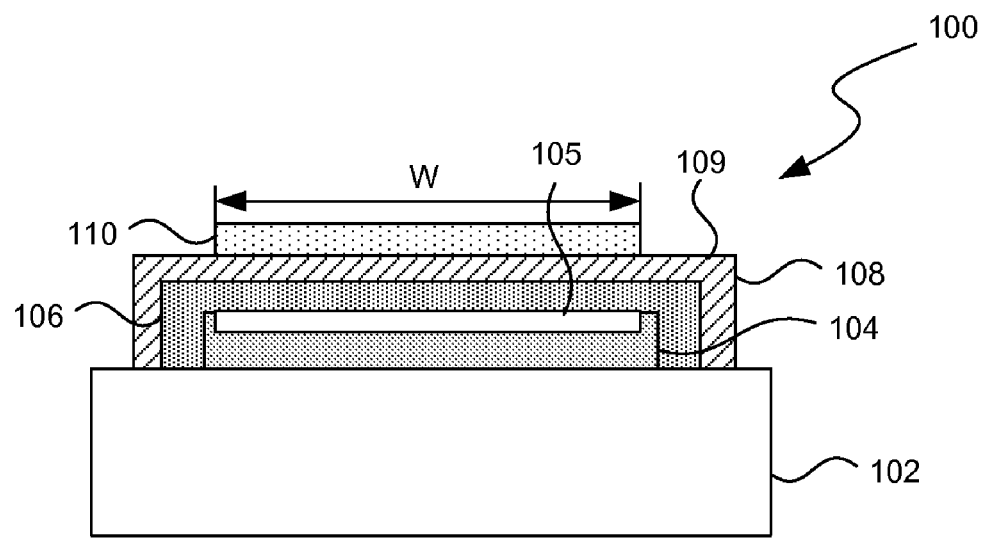

The converter material 110 in FIGS. 2A-2C is shown to generally encapsulate an underlying material (e.g., the conduction material 108 in FIG. 2A). However, in other embodiments, as shown in FIG. 2D, the converter material 110 may be formed only on a surface 109 of the conduction material 108. The surface 109 of the conduction material 108 faces away from the LED die 104. The converter material 110 may have a width W generally corresponding to the emission area 105 of the LED die 104 and/or other suitable widths. In further embodiments, the converter material 110 may have other configurations, as described in more detail below with reference to FIGS. 3A-4C.

Figure 3A:
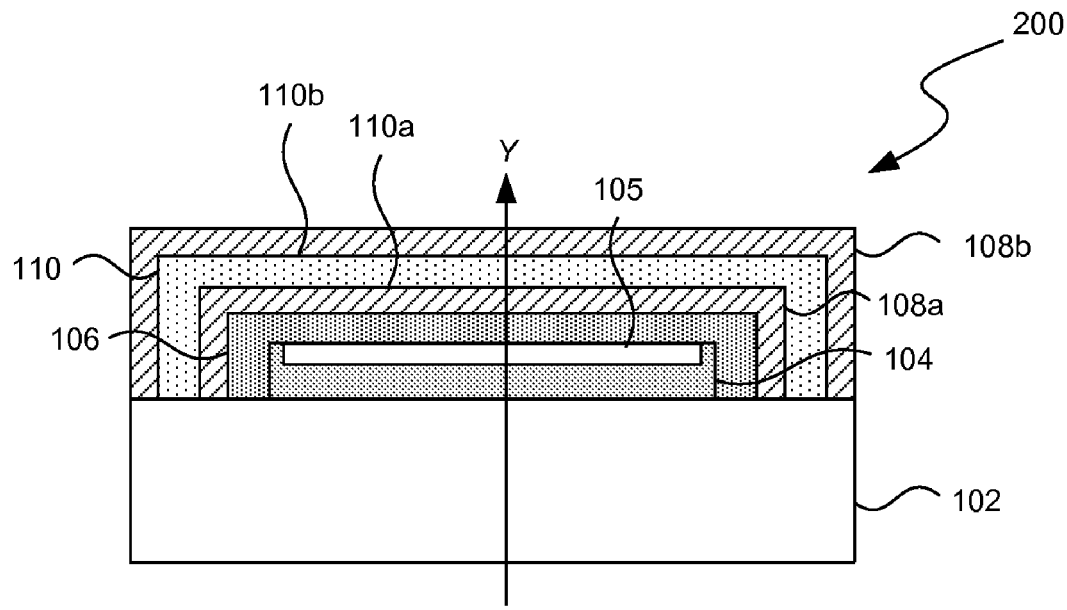
FIGS. 3A and 3B are schematic cross-sectional diagrams of an LED device with a plurality of layers of conduction material in accordance with embodiments of the technology.
Figure 3B:
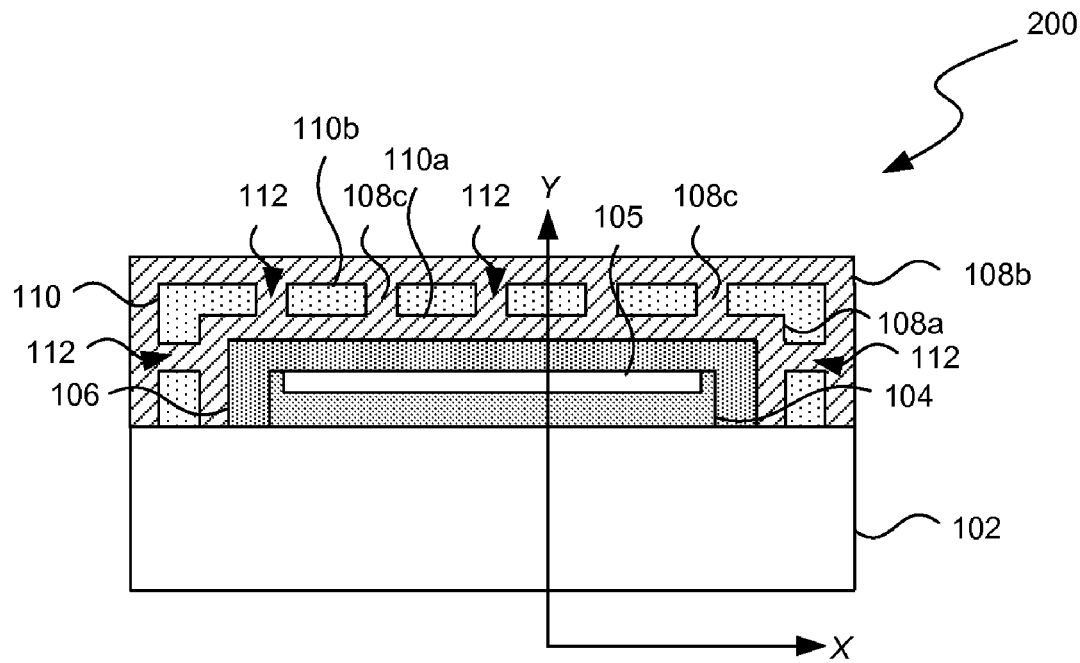

FIGS. 3A and 3B are schematic cross-sectional diagrams of an LED device 200 with a plurality of layers of conduction material in accordance with embodiments of the technology. The LED device 200, and other LED devices described herein, can include structures with functions generally similar to those described above with reference to FIGS. 2A-2D. As such, common acts and structures are identified by the same reference numbers. Only significant differences in operation and structure are described below.

As shown in FIG. 3A, the LED device 200 can include components generally similar to the LED device 100 of FIG.

2A except that the LED device 200 includes a first conduction material 108a and a second conduction material 108b separated from each other by the converter material 110. As a result, the first conduction material 108a is in direct contact with a first surface 110a of the converter material 110. The second conduction material 108b is in direct contact with a second surface 110b of the converter material 110.

In certain embodiments, the first and second conduction materials 108a and 108b can include generally the same material (e.g., ITO) with a generally similar thickness. In other embodiments, the first and second conduction materials 108a and 108b can include different materials. For example, the first conduction material 108a includes ITO, and the second conduction material 108b includes FTO. In further embodiments, the first and second conduction materials 108a and 108b can include the same material with different thicknesses and/or other physical characteristics.

It is believed that the first and second conduction materials 108a and 108b can improve the temperature homogeneity in the converter material 110 in a direction (as represented by the Y-axis) generally perpendicular to the first and second surfaces 110a and 110b of the converter material 110. It is believed that the converter material 110 may have internal temperature gradients along the Y-axis during operation due to low thermal conductivities. For example, if the generated heat is conducted away from only one surface (e.g., the first surface 110a) of the converter material 110, the opposing surface (e.g., the second surface 110b) of the converter material 110 may be at a higher temperature than the heat-conducting surface. As a result, the portion of the converter material 110 proximate to the second surface 110b may still suffer from thermal quenching. Accordingly, by conducting heat away from both the first and second surfaces 110a and 110b along two heat conduction paths formed by the first and second conduction materials 108a and 108b, the temperature profile of the converter material 110 along the Y-axis may be more homogeneous than conducting heat from only one surface of the converter material 110.

FIG. 3B is a schematic cross-sectional diagram of the LED device 200 with further improved temperature homogeneity in the converter material 110. As shown in FIG. 3B, the LED device 200 includes a plurality of vias 112 in the converter material 110 and individually holding a third conduction material 108c. In the illustrated embodiment, the vias 112 individually include a generally linear passage extending directly between the first and second conduction materials 108a and 108b. In other embodiments, the vias 112 can also include a serpentine passage, a stepped passage, and/or other suitable configurations. The first, second, and third conduction materials 108a, 108b, and 108c may include the same material (e.g., ITO) or may include different materials and/or physical characteristics.

It is believed that the third conduction material 108c can further improve the temperature homogeneity in the converter material 110 by equalizing temperature gradients in another direction (as represented by the X-axis) generally parallel to the first and second surfaces 110a and 110b. It is believed that the converter material 110 may have internal temperature gradients not only along the Y-axis, as discussed above, but also along the X-axis during operation due to its low thermal conductivities. As a result, one portion of the converter material 110 may still experience thermal quenching when another portion laterally spaced apart is operating normally. Accordingly, by having a plurality of vias 112 along the X-axis, the third conduction material 108c may form another heat conduction path generally perpendicular to those formed by the first and second conduction materials 108a and 108b. Thus, the temperature profile of the converter material 110 along the X-axis may be more homogeneous than without such conduction paths.

Even though only one converter material 110 is shown in FIGS. 3A and 3B, in certain embodiments, the LED device 200 can also include a plurality of repeating patterns of the first conduction material 108a, the converter material 110, and the second conduction material 108b formed on one another in series. In other embodiments, the repeating patterns may also include the third conduction material 108c (as shown in FIG. 3B). In further embodiments, the LED device 200 may include more than one LED die 104, as described in more detail below with reference to FIGS. 4A-4C.

Figure 4A:
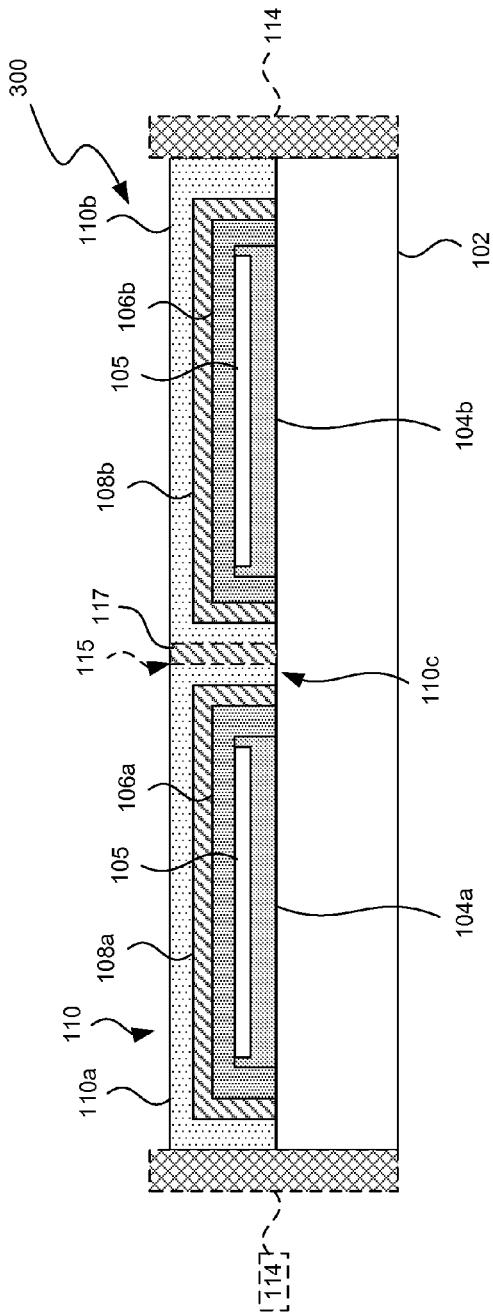
FIGS. 4A-4C are schematic cross-sectional diagrams of an LED device with a plurality of LED dies in accordance with embodiments of the technology.
Figure 4B:
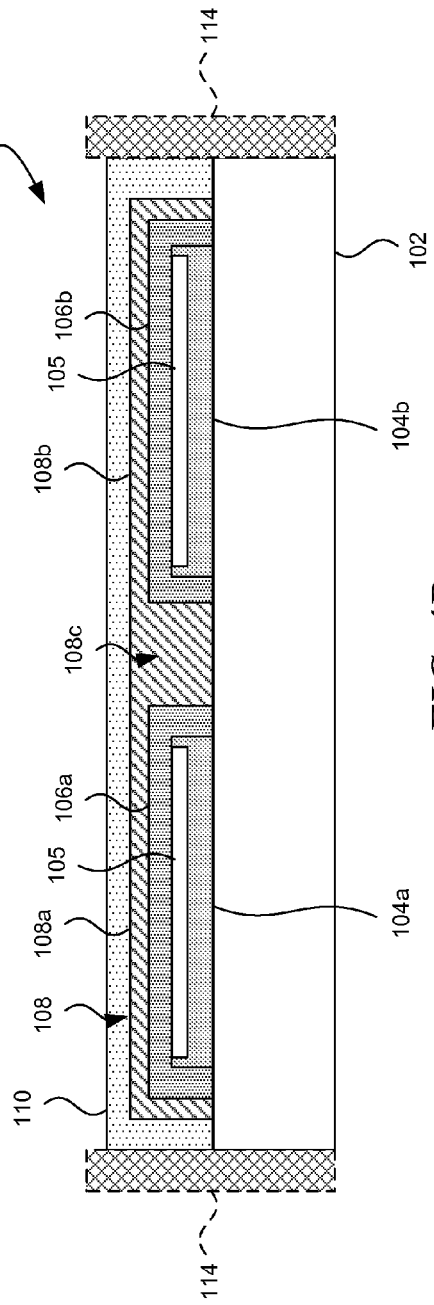
Figure 4C:
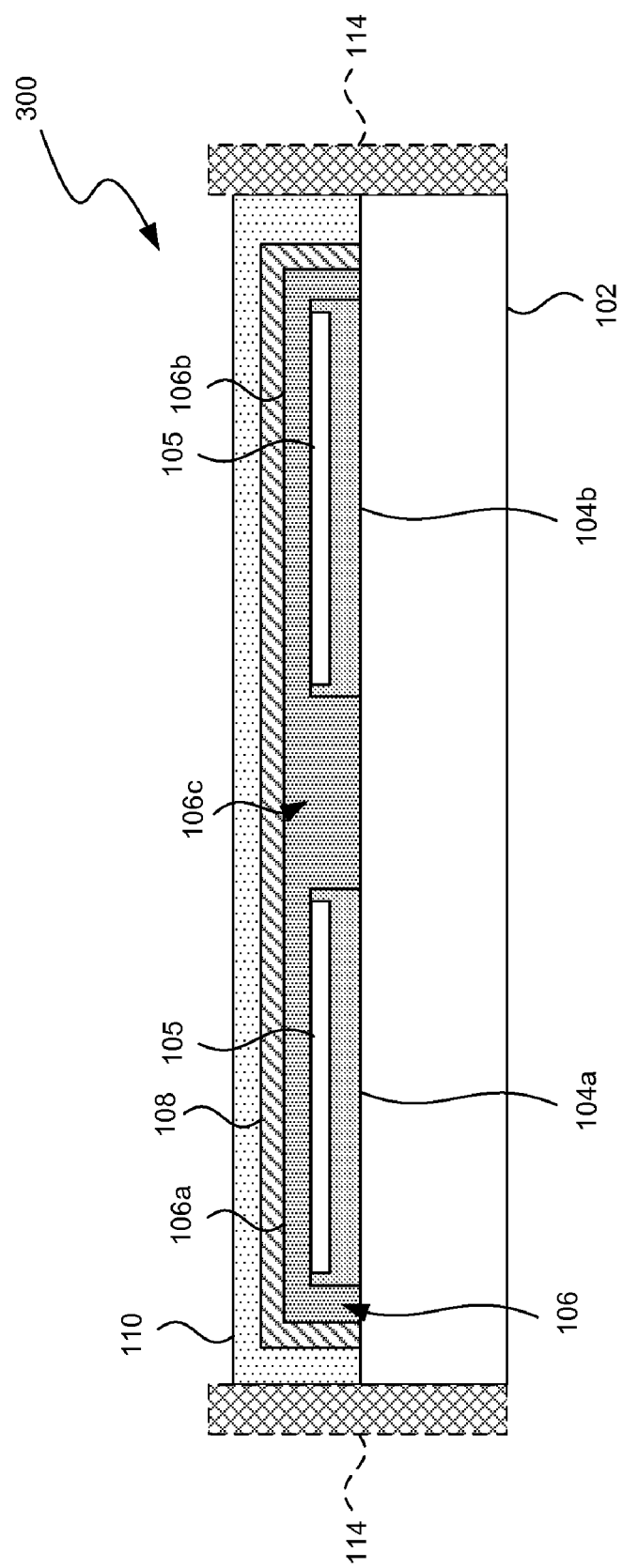

FIGS. 4A-4C are schematic cross-sectional diagrams of an LED device 300 with a plurality of LED dies in accordance with embodiments of the technology. Two LED dies are shown in FIGS. 4A-4C for illustration purposes even though the LED device 300 may include three, four, or any other desired number of LED dies for certain applications.

As shown in FIG. 4A, the LED device 300 includes a first LED die 104a and a second LED die 104b carried by the substrate 102 in a side-by-side arrangement. A first insulating material 106a and a first conduction material 108a are formed on the first LED die 104a. A second insulating material 106b and a second conduction material 108b are formed on the second LED die 104b. In the illustrated embodiment, the first and second LED dies 104a and 104b may be generally similar in structure and function. In other embodiments, the first and second LED dies 104a and 104b may have different structures and/or functions.

The LED device 300 can also include a converter material 110 encapsulating the first and second conduction materials 108a and 108b. Thus, the converter material 110 can include a first portion 110a generally corresponding to the first LED die 104a, a second portion 110b generally corresponding to the second LED die 104b, and a third portion 110c between the first and second LED dies 104a and 104b. During assembly, dams 114 (shown in phantom lines for clarity) may be placed against the substrate 102, and the converter material 110 may be spin coated, injected, and/or otherwise applied to fill the space between the dams 114 and the substrate 102. In other embodiments, the converter material 110 may be formed via other suitable techniques with or without the dams 114.

Optionally, the LED device 300 may also include an aperture 115 in the third portion 110c of the converter material 110. The aperture 115 may hold a conduction material 117 that is in direct contact with the substrate 102. During assembly, the optional aperture 115 may be formed via patterning the converter material 110 via photolithography, and removing a portion of the converter material 110 from the third portion 110c via dry etching, wet etching, and/or other suitable material removal techniques. In further embodiments, the aperture 115 may be omitted.

FIG. 4B illustrates another embodiment of the LED device 300 in which the conduction material 108 encapsulates both the first and second insulating materials 106a and 106b. As a result, the conduction material 108 includes a first portion 108a generally corresponding to the first LED die 104a, a second portion 108b generally corresponding to the second LED die 104b, and a third portion 108c between the first and second LED dies 104a and 104b.

FIG. 4C illustrates an additional embodiment of the LED device 300 in which the insulating material 106 encapsulates the first and second LED dies 104a and 104b. As a result, the insulating material 106 includes a first portion 106a generally corresponding to the first LED die 104a, a second portion

We claim:

1. A light emitting diode (LED) device, comprising:
   a substrate with a thermal conductivity of greater than about 1.0 W/(m·K);
   an LED die carried by the substrate, the LED die being thermally coupled to the substrate;
   an insulating material on the LED die, the insulating material being at least partially transparent;
   a converter material spaced apart from the LED die, the converter material including a phosphor; and
   a conduction material in direct contact with both the converter material and the substrate, the conduction material having a thermal conductivity greater than about 1.0 W/(m·K), wherein the conduction material includes a lateral portion across from a forward-facing surface of the LED die and at least one vertical portion extending from the lateral portion toward the substrate such that the conduction material at least substantially covers the LED die.

2. The LED device of claim 1 wherein:
   the substrate includes at least one of silicon (Si), gallium nitride (GaN), aluminum nitride (AlN), copper (Cu), aluminum (Al), tungsten (W), stainless steel (Fe), diamond (C), glass ($SiO_2$), silicon carbide (SiC), and aluminum oxide ($Al_2O_3$);
   the LED die includes an N-type gallium nitride (GaN) material, an indium gallium nitride (InGaN) material, and a P-type GaN material on one another in series;
   the insulating material includes at least one of a polyimide, a solvent-soluble thermoplastic polyimide, a ceramic material, and glass, the insulating material having a thermal conductivity less than about 0.15 W/(m·K);
   the converter material includes at least one of cerium(III)-doped yttrium aluminum garnet ("YAG"), neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, and terbium-doped YAG, CaS:Eu, $CaAlSiN_3$:Eu, $Sr_2Si_5N_8$:Eu, SrS:Eu, $Ba_2Si_5N_8$:Eu, $Sr_2SiO_4$:Eu, $SrSi_2N_2O_2$:Eu, $SrGa_2S_4$:Eu, $SrAl_2O_4$:Eu, $Ba_2SiO_4$:Eu, $Sr_4All_4O_{25}$:Eu, $SrSiAl_2O_3N$:Eu, $BaMgAl_{10}O_{17}$:Eu, $Sr_2P_2O_7$:Eu, $BaSO_4$:Eu, and $SrB_4O_7$:Eu; and
   the conduction material includes at least one of indium tin oxide (ITO), fluorine-doped tin oxide (FTO), and zinc oxide (ZnO).

3. The LED device of claim 1 wherein the conduction material is between the converter material and the insulating material.

4. The LED device of claim 1 wherein the converter material is between the conduction material and the insulating material.

5. The LED device of claim 1 wherein the vertical portion of the conduction material includes two opposing vertical portions extending from the lateral portion toward and in direct contact with the substrate.

6. The LED device of claim 1 wherein:
   the vertical portion of the conduction material includes two opposing vertical portions extending from the lateral portion toward and in direct contact with the substrate; and
   the converter material generally encapsulates the conduction material.

7. The LED device of claim 1 wherein:
   the vertical portion of the conduction material includes two opposing vertical portions extending from the lateral portion toward and in direct contact with the substrate;
   the lateral portion of the conduction material includes a surface facing away from the LED die; and
   the converter material is on the surface of the conduction material and with a width generally corresponding to an emission area of the LED die.

8. The LED device of claim 1 wherein:
   the conduction material is a first conduction material between the converter material and the insulating material; and
   the LED device further includes a second conduction material spaced apart from the first conduction material and in direct contact with the converter material.

9. The LED device of claim 1 wherein:
   the conduction material is a first conduction material between the converter material and the insulating material;
   the LED device further includes a second conduction material spaced apart from the first conduction material and in direct contact with the converter material;
   the converter material includes a plurality of vias extending from the first conduction material to the second conduction material; and
   the plurality of vias individually contain a third conduction material.

10. The LED device of claim 1 wherein:
    the LED die is a first LED die;
    the LED device further includes a second LED die carried by the substrate in a side-by-side arrangement with the first LED die; and
    at least one of the insulating material, the converter material, and the conduction material encapsulates the first and second LED dies.

11. The LED device of claim 1 wherein at least a portion of the conduction material comprises an at least generally transparent material.

12. The LED device of claim 1 wherein the insulating material, the conduction material, and the converter material are adjacent to each other in series.

* * * * *

UNITED STATES PATENT AND TRADEMARK OFFICE
CERTIFICATE OF CORRECTION

PATENT NO. : 8,384,105 B2  Page 1 of 1
APPLICATION NO. : 12/727943
DATED : February 26, 2013
INVENTOR(S) : Kevin Tetz et al.

It is certified that error appears in the above-identified patent and that said Letters Patent is hereby corrected as shown below:

In the Claims

In column 7, line 39, in Claim 2, delete "(AIN)." and insert -- (AIN), --, therefor.

In column 7, lines 60-61, in Claim 2, delete "$Sr_2SiO_4$ :Eu, $SrSi_2N_2O_2$ :Eu, $SrGa_2S_4$ :Eu, $SrAl_2O_4$ :Eu, $Ba_2SiO_4$ :Eu, $Sr_4All_4O_{25}$ :Eu," and insert -- $Sr_2SiO_4$:Eu, $SrSi_2N_2O_2$:Eu, $SrGa_2S_4$:Eu, $SrAl_2O_4$:Eu, $Ba_2SiO_4$:Eu, $Sr_4Al_{14}O_{25}$:Eu, --, therefor.

In column 7, line 62, in Claim 2, delete "$BaMgAl_{10}O_{17}$:Eu," and insert -- $BaMgAl_{10}O_{17}$:Eu, --, therefor.

Signed and Sealed this
Seventh Day of May, 2013

Teresa Stanek Rea
*Acting Director of the United States Patent and Trademark Office*